United States Patent
Kubinec

[11] Patent Number: 6,031,473
[45] Date of Patent: Feb. 29, 2000

[54] DIGITAL COMMUNICATIONS USING SERIALIZED DELAY LINE

[75] Inventor: James Kubinec, Reno, Nev.

[73] Assignee: Advanced Micro Devices, Inc., Sunnyvale, Calif.

[21] Appl. No.: 08/972,227

[22] Filed: Nov. 17, 1997

[51] Int. Cl.[7] .................................................. H03M 9/00
[52] U.S. Cl. .......................................... 341/100; 341/101
[58] Field of Search ..................................... 341/100, 101

[56] References Cited

U.S. PATENT DOCUMENTS

| | | |
|---|---|---|
| 5,034,908 | 7/1991 | Hartley et al. ................ 364/724.16 |
| 5,132,572 | 7/1992 | Woo . |
| 5,220,216 | 6/1993 | Woo . |
| 5,227,679 | 7/1993 | Woo . |
| 5,264,745 | 11/1993 | Woo . |
| 5,349,612 | 9/1994 | Guo et al. . |
| 5,363,419 | 11/1994 | Ho . |
| 5,367,542 | 11/1994 | Guo . |
| 5,400,370 | 3/1995 | Guo . |
| 5,451,894 | 9/1995 | Guo . |
| 5,452,333 | 9/1995 | Guo et al. . |
| 5,457,336 | 10/1995 | Fang et al. . |
| 5,457,719 | 10/1995 | Guo et al. . |
| 5,490,282 | 2/1996 | Dreps et al. .................. 395/821 |

*Primary Examiner*—Brian Young
*Assistant Examiner*—Peguy JeanPierre

[57] ABSTRACT

A digital data transmission system used to transfer data between devices implements a serial bus to interconnect the devices. The system includes a delay line serializer having a bit serializer and a detection delay line to convert parallel data into serial data for transmission on the serial data bus. An optional clock multiplier coupled to a local clock increases the rate in which data is transferred onto the serial bus.

10 Claims, 5 Drawing Sheets

6,031,473

DIGITAL COMMUNICATIONS USING SERIALIZED DELAY LINE

FIELD OF THE INVENTION

This invention relates to digital transmission and more particularly to serializing data to be transmitted over a bus.

BACKGROUND OF THE INVENTION

In data communications systems, data is often transmitted between devices via a parallel data bus. The number of lines connecting the devices is determined by the number of data bits, N, in the parallel bus. Additional control signals, such as transmit data strobe and receive data strobe may be required and may also require separate lines in the parallel data bus. However, for simplicity, it will be assumed that the number of lines in the parallel data bus is equal to the number of data bits, N.

The rate at which the data is transmitted (information rate), is given by the number of lines, N, multiplied by the number of times per second new information can be applied to the bus (bus word rate). Therefore, the information rate is given by (N) X (bus word rate).

In a controlled environment in which distance between devices is limited, such as on an integrated circuit (IC) chip or printed circuit (PC) board, each line can normally be switched at a much higher rate than the bus word rate. Increasing the switching rate results in a corresponding increase in the information rate. However, increasing the switching rate for all N lines in the parallel bus concomitantly increases the amount of power that must be dissipated in the IC chip or PC board. This increased power dissipation could cause internal circuit elements to fail. In addition, an increased switching rate also increases the amount of electromagnetic interference (EMI) or noise induced on other components in the circuit. EMI associated with switching multiple pins simultaneously could cause a circuit to misoperate and transmit faulty data onto the bus.

FIG. 1 shows a conventional digital data communication system utilizing an N bit parallel data bus, in this example an eight bit bus which requires eight individual wires to interconnect functional blocks 12, 14 and 16. Alternatively, the N-bit bus may be 16 bits in width, 32 bits or any other number that a particular system may utilize. However, the wider the data bus is, the number of wires needed to interconnect functional blocks 12, 14 and 16 is greater.

Attempting to increase information rate by increasing the width of the data bus adds to hardware requirements by increasing the number of lines in the parallel data bus. Correspondingly, this also increases the number of IC pins required to input and output the data between the functional blocks. In addition, as noted above, attempting to increase the information rate by increasing the rate at which data is switched on the parallel bus results in increased power dissipation and EMI on the components in the circuit.

In view of the above, a need exists for increasing the information rate of data being transferred between devices while keeping the amount of noise and power dissipation to a minimum. It additionally is desirable to increase the information rate while maintaining accurate, regulated data transmissions.

SUMMARY OF THE INVENTION

A primary object of the invention is to transfer data between devices with lower EMI and less power dissipation than experienced using conventional IC chip parallel buses.

Another object of the invention is to transfer data between devices at a high information rate without using conventional IC chip parallel buses.

To achieve the foregoing and other objects and advantages, the present invention utilizes a serial data bus which interconnects various devices. Each device includes a circuit which converts parallel input data into a serial format. The circuit comprises an input register for latching parallel data and a bit serializer connected to the input register. The bit serializer receives the parallel data and outputs corresponding serial data which is then transferred via the serial data bus. The bit serializer is used in conjunction with a detection delay line which is comprised of serially connected delay units which are used in the bit serialization process.

The information rate of the data transmission system can be increased by using a clock multiplier within each individual device in the system. A clock multiplier multiplies the clock frequency of a local clock contained on each device and outputs a new clock signal with an increased frequency. This new clock signal clocks the data through the bit serializer and results in the data being transferred at a higher rate than if just the local clock is used.

In accordance with one aspect of the invention, data transferred between devices via the serial bus is converted into parallel data within the receiving device. A deserializer is connected to the serial data bus for receiving the serial input data and outputs parallel data for use within the receiving device.

In accordance with another aspect of the invention, the devices connected to the serial bus comprise integrated circuit (IC) chips. Alternatively, the devices connected to the serial bus may comprise printed circuit (PC) boards.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

DETAILED DESCRIPTION OF THE INVENTION

Figure 2:
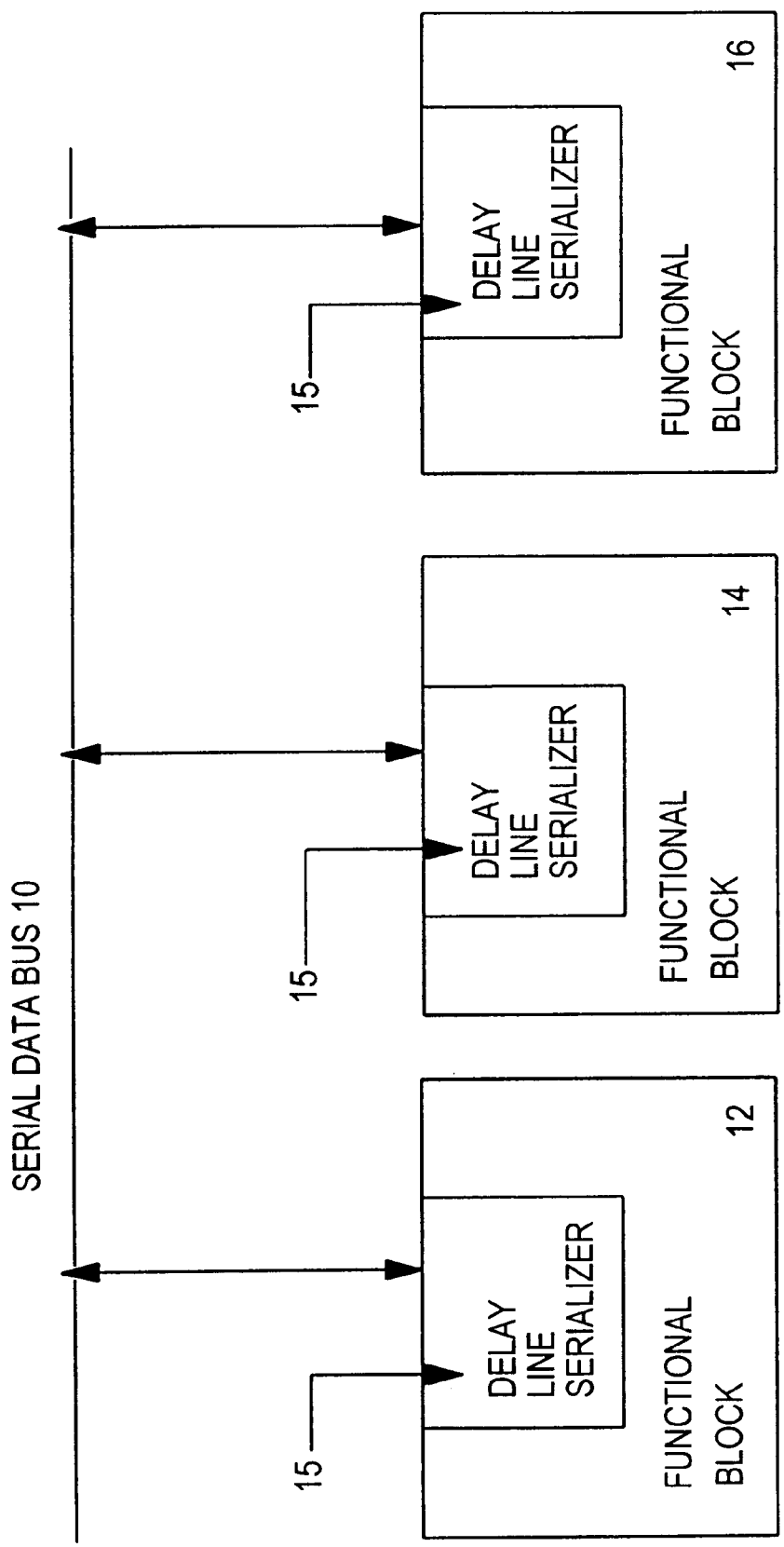
FIG. 2 is a block diagram of a bus communications system utilizing a delay line serializer and serial bus in accordance with the invention.

FIG. 2 shows a functional block diagram of a bus communications system utilizing a serial data bus 10 to communicate data between functional blocks 12, 14 and 16. Each functional block may comprise an integrated circuit (IC) chip or a printed circuit (PC) board comprising a system of IC chips.

Each functional block shown in FIG. 2 includes a delay line serializer 15. The delay line serializer 15 converts internal parallel data into corresponding serial data for transmission onto the serial data bus 10. Details of the delay line serializer are shown in FIG. 3.

Figure 3:
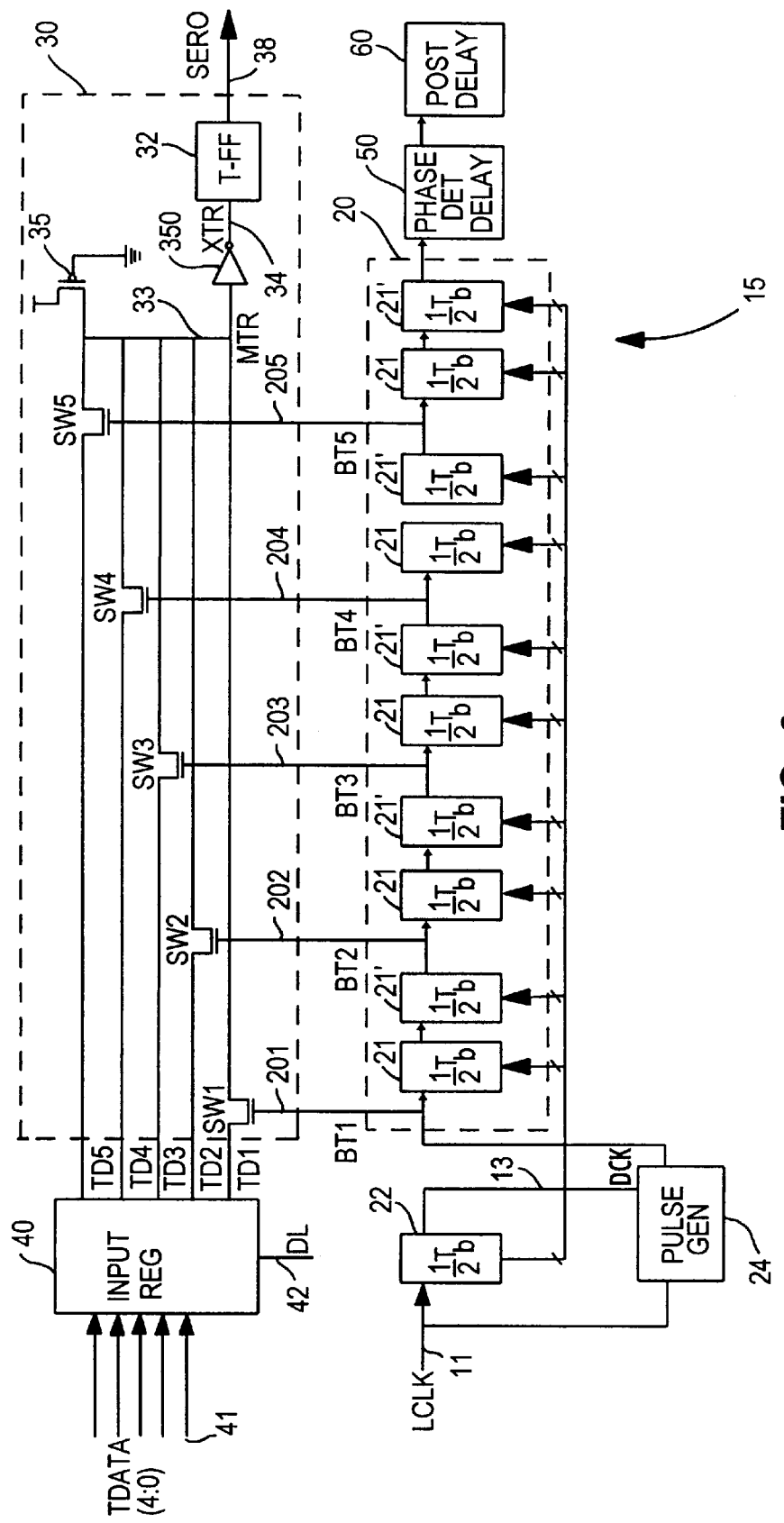
FIG. 3 is a detailed block diagram of the delay line serializer of FIG. 2.

With reference to FIG. 3, the delay line serializer 15 comprises two main parts: a bit serializer 30 and a detection delay line 20. The detection delay line 20, shown outlined by dashed lines, comprises a sequence of delay units 21 and 21'. Each of the delay units 21, 21' has a delay equal to one half of the bit period, ½ Tb, where Tb is the bit period of the serially transmitted data frequency.

An input register 40 latches parallel internal input data which is generated within the functional block. The input register 40 supplies the data to the bit serializer via lines TD1 through TDN (TD5). The operation of the delay line serializer 15 is more fully described in U.S. Pat. No. 5,349,612, assigned to the assignee of the present invention, and is incorporated herein by reference.

The delay units 21, 21' are cascaded in series to form the detection delay line 20. A pair of the delay units 21 (front unit) and 21' (rear unit) forms a bit delay unit which establishes a delay of one bit period. A single delay unit 22 switches a pulse generator 24 to generate a pulse for every occurrence of a rising edge of the reference LCLK, the width of which is equal to one half of the bit period. The output taps from the delay line BT1 through BTN (BT5) are applied to the control terminal of a series of switches, in this example the gates of the MOS switches SW1 through SWN (SOW) in the Bit Serializer 30, after the parallel data is latched in the input register and supplied to the bit serializer via lines TD1 through TDN (TD5). The serialized output data is available from the output of a toggle flip-flop 32 (TFF) on line 38.

The phase detection delay unit 50 and post delay unit 60 phase compare and track the pulse when the delay of the delay units are not equal to their nominal value, ½ Tb. How the delay of the delay units is established is described in U.S. Pat. No. 5,349,612.

The operation of the circuit is more easily understood if it is assumed that the delay units are calibrated to their nominal value in the data serialization process. It is also assumed that the parallel data is in Non-Return-to-Zero (NRZ) form, while the transmitted serial data is in Non-Return-to-Zero-Inverted-on-one (NRZI) format, in which a data bit "1" is represented by a transition and data bit "0" is represented by no transition.

FIGS. 4(a)–(l) represent a timing diagram for the circuit of FIG. 3. For simplicity, assume N=5 in FIG. 3. However, the concepts described herein apply equally to different values of N. In the Fiber Distributed Data Interface (FDDI) standard, 4 bit (half byte) data are first encoded into a 5-bit symbol and then serialized for transmission. The local reference clock LCLK runs at the symbol rate which is ⅕ of the bit rate. LCLK running at the symbol rate is applied to the delay unit and to the pulse generator. DCK, the delayed version of the LCLK, FIG. 4(c), is also supplied to the pulse generator 24 on line 13.

Figure 4:
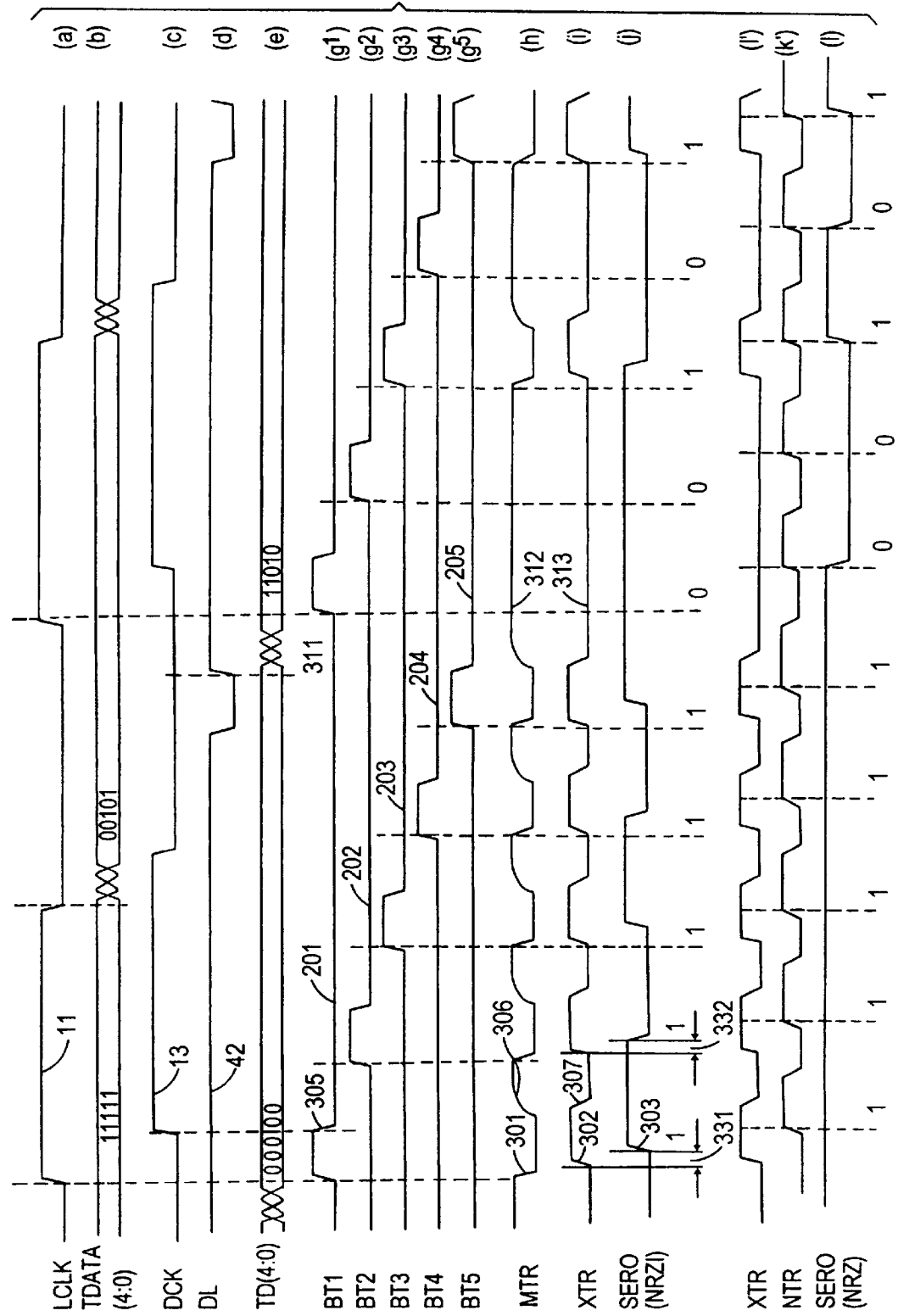
FIG. 4, consisting of FIGS. 4(a)–(l), is a detailed timing diagram of the circuit shown in FIG. 3.

The pulse generator 24 outputs pulses BT1 for every byte clock period, FIG. 4(g1), and the width of the pulse is determined by the delay value of delay unit 22, which is assumed calibrated to ½ Tb. The pulse of BT1 travels in the delay line 20 and is delayed for the interval of a bit period each time it arrives at BT2 through BT5, FIGS. 4(g2–g5).

The parallel data TDATA are latched into the input register and are valid at outputs TD1 through TD5 by the rising edge of DL, FIG. 4(d), before the rising edge of the pulse of BT1, FIG. 4(g1). TD1 through TD5 are complements of TDATA. For the example waveform of FIG. 4(b), the first byte is assumed to be an all "one" data byte which is latched for the first byte. The latched data at TD1 through TD5 are then all "0"s.

Node 33 at the input of inverter 350 is pulled up to high by device 35 if none of the MOS switches SW1-SOW are on. When the pulse of BT1 arrives, it turns on MOS switch SW1 for the duration of ½ Tb. Since output TD1 to which SW1 is connected is low, MTR on node 33 is pulled down to low for the duration of ½ Tb, FIG. 4(h) The negative transition of MTR on node 33 imparts a positive transition of XTR to node 34, which in turn toggles the TFF 32 to produce an output transition of SERO at 38, (FIG. 4, 302, 303). A data bit "1" is thus sent. One half bit period later, BT1 returns to low (FIG. 4, 305) to turn SW1 off, and device 35 pulls node 33 back to supply voltage or "high" to cause XTR on node 34 to return to zero (FIG. 4, 306, 307).

When the pulse arrives at node 202, SW2 turns on to cause another transition at output SERO 38 to transmit another bit "1". The whole byte of "1"s is transmitted in the same fashion. If, however, there are "0"s in the data, such as the first bit of the second byte in FIG. 4(b), no transition will occur at output SERO. This is because a data bit "0" is represented by a "1" or a "high" at TD1, and when a pulse of BT1 arrives to turn on SW1 (FIG. 4, 311), MTR on node 33 will remain high since TD1 is also high. No transition occurs at MTR or XTR (FIG. 4, 312, 313), and subsequently at output SERO. A data bit "0" is transmitted by means of "no transition" in the output signal. A design requirement for the TFF 32 is that a matched clock-to-rise (FIG. 4, 331) and clock-to-fall (FIG. 4, 332) is desired, or duty cycle distortion type of timing jitter will be added to the transmitted data.

There are many different ways to construct the half bit delay units 21 and 21'. Generally, each delay unit comprises two parts: a coarse step unit and a fine step unit. The coarse step unit is formed by a fixed-stage delay and a variable-stage delay. There are k stages of delay cells in the fixed-staged delay and m stages of delay cells in the variable-stage delay. However, other methods of constructing the half bit delay units are also suitable for use in the delay line serializer of the present invention. Details of the construction and calibration of the delay units are described more fully in U.S. Pat. No. 5,349,612.

Figure 5:
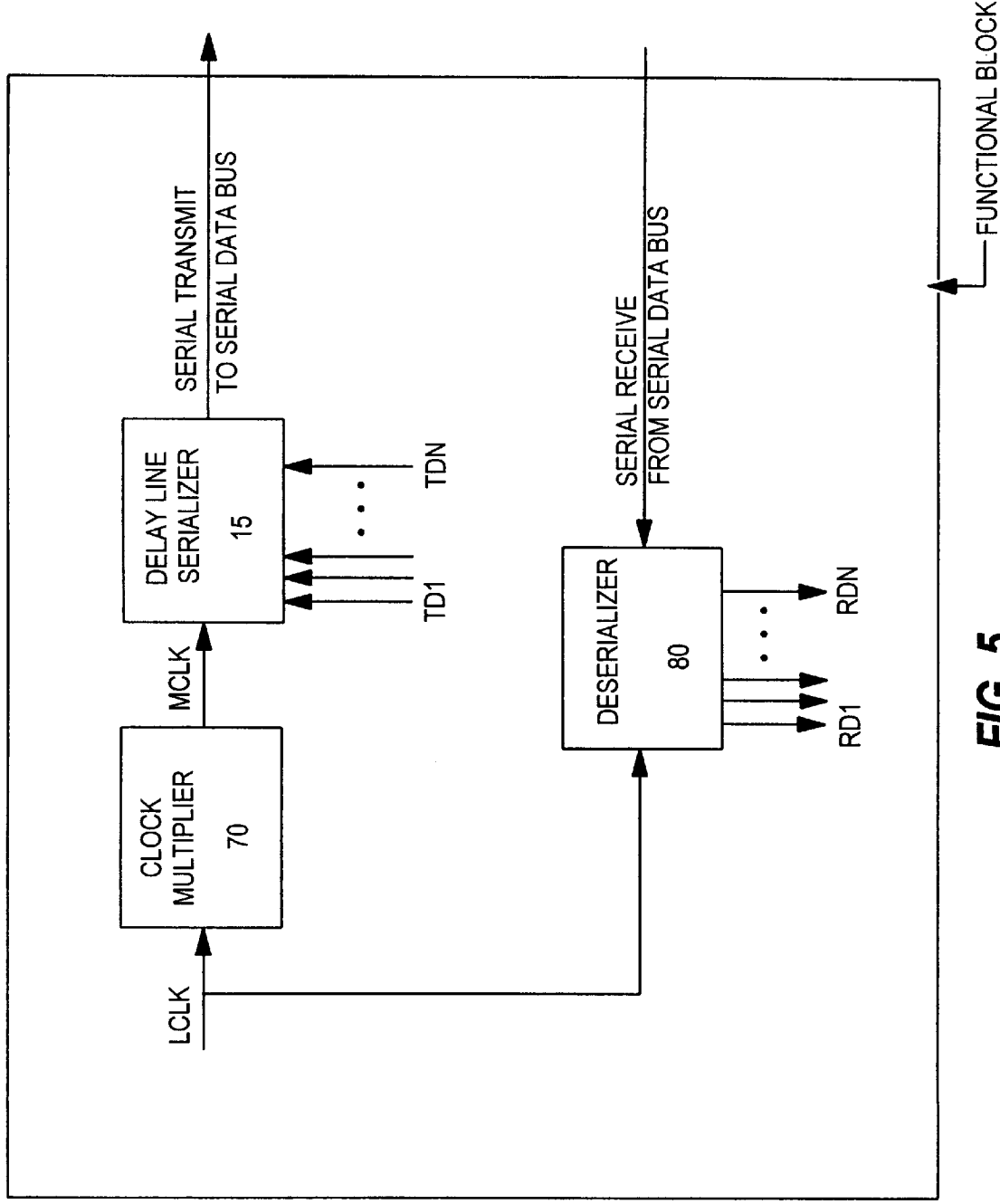
FIG. 5 is a block diagram of the bus communications system utilizing a clock multiplier, delay line serializer and deserializer in accordance with the invention.

In accordance with FIG. 5, the data information rate of the present invention increases over that shown in FIG. 3 by coupling a clock multiplier 70 to the local clock, LCLK. A clock multiplier 70 multiplies the frequency of a local clock and produces an output clock MCLK, having a frequency of M times the local clock, where M is a value chosen by the system designer. The bit frequency of the serial output, SERO, increases by a factor of M, over the bit frequency of the system in FIG. 3, by using the clock multiplier 70.

For example, assume that the clock multiplier 70 is chosen with a multiplication value, M, equal to two. The bit frequency of the serial output data, SERO, is twice the bit frequency of the system in FIG. 3 and correspondingly, SERO is transmitted in one half the time shown in FIG. 4. Essentially, the entire timing diagram of FIG. 4 is compressed in half along the time axis and the resulting data transmission rate doubles. Alternatively, the clock multiplier 70 could multiply the LCLK by any other number M which will result in increasing the information rate by a factor of M.

The use of the clock multiplier 70 in conjunction with the delay line serializer 15 enables the data to be transmitted at a higher bit frequency than if the local clock alone was used. However, using the clock multiplier with the delay line serializer does not significantly increase the induced EMI or power dissipation on the other circuit components in FIG. 2 since only a single line of data is being switched at a time. Therefore, the information rate of the system increases while maintaining low EMI and low power dissipation.

The clock multiplier 70 of FIG. 5 can be any one of the many conventional clock multiplier devices which are known in the art. The clock multiplier used accepts a local clock input of frequency f, and outputs a new clock with the frequency of f multiplied by M, where M is a value chosen by the system designer. In an environment in which the transmission distance is short, the present invention achieves very high transmission rates of $2\times10^9$ bits per second or higher.

With reference to FIG. 5, a deserializer 80 is shown included within the functional block. The deserializer 80 receives the serial data from serial data bus 10 of FIG. 2 and recovers data, RD1 through RDN for use within the functional block. Details of the deserializer are described more fully in U.S. Pat. No. 5,400,370, assigned to the assignee of the present invention, and incorporated herein by reference.

Described has been a system and method for replacing conventional parallel chip buses with a single serial data bus through the use of a digital delay line serializer. In the controlled environment contemplated by the present invention in which the transmission distance is short, the invention achieves very high transmission rates of $2\times10^9$ bits or higher without sacrificing data integrity. This enables the present invention to replace most conventional parallel chip buses with the serial bus described.

Figure 1:
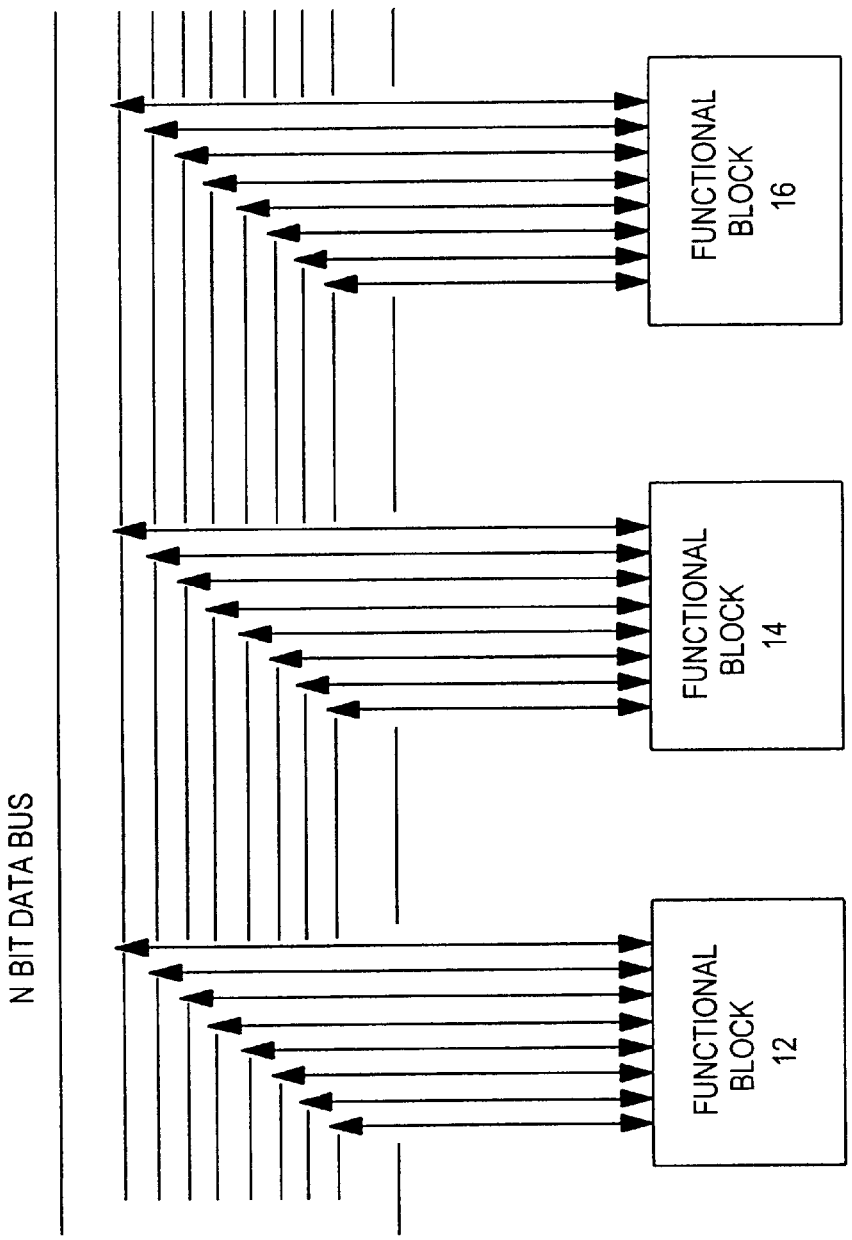
FIG. 1 is a block diagram of a conventional bus communications system using a parallel data bus.

Each functional block shown in FIG. 2 utilizes a single input/output connection from serial data bus 10. Therefore, an advantage over the parallel data bus of FIG. 1 is a reduction in the number of lines interconnecting the functional blocks and a corresponding reduction in the number of input/output pins required to transfer data to/from the serial data bus 10. Additional advantages obtained from the present invention include less EMI and lower power dissipation.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A data transmission system comprising:
   a first integrated circuit including a first circuit having an input for receiving input data and an output pin for transmitting corresponding serial output data;
   a second integrated circuit including an input pin and a second circuit for receiving the serial output data from the first circuit; and
   a serial bus coupled to the output pin of the first integrated circuit and the input pin of the second integrated circuit;
   the first circuit further including:
      an input register for latching parallel data;
      a bit serializer coupled to the input register and having a data line for each parallel bit of data, the bit serializer for providing the serial output data;
      a detection delay line having a plurality of taps coupled to the bit serializer, and comprising serially connected delay units;
      a clock signal source; and
      a clock multiplier coupled to the detection delay line and configured to receive the clock signal, the clock multiplier operative for multiplying the frequency of the clock signal in order to increase the rate at which the serial output data is transmitted;
   wherein the second circuit includes a bit deserializer for converting input data from the serial bus into parallel data for use within the second circuit.

2. The system of claim 1, further comprising a predetermined number of additional circuits coupled to the serial bus for transmitting and receiving data over the serial bus.

3. The system of claim 1, wherein the first and second integrated circuits are located on separate printed circuit boards.

4. A data transmission system comprising:
   a plurality of circuits coupled to a serial bus for receiving and transmitting data over the serial bus;
   each of the plurality of circuits further comprising:
      an input register for latching parallel data generated within the circuit;
      a bit serializer coupled to the input register and having a data line for each parallel bit of data, the bit serializer for providing serial output data; and
      a detection delay line comprising a plurality of serially connected delay units, each delay unit having a delay equal to ½ Tb, where Tb is the bit period of the serially transmitted data frequency, the detection delay line further having a plurality of output taps coupled to the bit serializer for switching the output of the bit serializer;
   wherein at least one of the plurality of circuits further comprises:
      a clock signal; and
      a clock multiplier coupled to the detection delay line and configured to receive the clock signal, the clock multiplier operative for multiplying the frequency of the clock signal to increase the rate at which the serial output data is transmitted.

5. The system of claim 4, wherein each of the plurality of circuits also includes a deserializer for converting received input data from the serial bus into parallel data for use within the receiving circuit.

6. The system of claim 4, wherein the plurality of circuits are located on separate integrated circuits.

7. The system of claim 4, wherein the plurality of circuits are located on separate printed circuit boards.

8. The apparatus of claim 4, wherein each data line in the bit serializer includes a switch connected to one of the output taps of the detection delay line.

9. A data transmission system comprising:
   a first integrated circuit including a first circuit having an input for receiving input data and an output pin for transmitting corresponding serial output data;
   a second integrated circuit including an input pin and a second circuit for receiving the serial output data from the first circuit; and
   a serial bus coupled to the output pin of the first integrated circuit and the input pin of the second integrated circuit;

the first circuit further including:
- an input register for latching parallel data,
- a bit serializer coupled to the input register and having a data line for each parallel bit of data, the bit serializer for providing the serial output data,
- a detection delay line having a plurality of taps coupled to the bit serializer, and comprising serially connected delay units, and
- a clock multiplier coupled to the detection delay line and configured to receive a clock signal, the clock multiplier further configured to multiply the frequency of the clock signal to increase the rate at which the serial output data is transmitted,
- wherein the second circuit further includes a bit deserializer for converting input data from the serial bus into parallel data for use within the second circuit.

10. The data transmission system of claim 9, wherein the first and second integrated circuits are located on separate printed circuit boards.

* * * * *